US007119632B2

(12) United States Patent
Blacka et al.

(10) Patent No.: US 7,119,632 B2
(45) Date of Patent: Oct. 10, 2006

(54) HIGH-FREQUENCY TEMPERATURE-VARIABLE ATTENUATOR

(75) Inventors: Robert J. Blacka, Pennsauken, NJ (US); David A. Raymond, Port Saint Lucie, FL (US)

(73) Assignee: Smiths Interconnect Microwave Components, Inc., Stuart, FL (US)

( * ) Notice: Subject to any disclaimer, the term of this patent is extended or adjusted under 35 U.S.C. 154(b) by 134 days.

(21) Appl. No.: 10/912,731

(22) Filed: Aug. 5, 2004

(65) Prior Publication Data

US 2006/0028290 A1 Feb. 9, 2006

(51) Int. Cl.
*H03H 11/24* (2006.01)

(52) U.S. Cl. .................................... 333/81 A; 338/216

(58) Field of Classification Search ............. 333/81 A, 333/81 R; 338/22 R, 216

See application file for complete search history.

(56) References Cited

U.S. PATENT DOCUMENTS 5,332,981 A * 7/1994 Mazzochette et al. .... 333/81 R
6,081,728 A * 6/2000 Stein et al. ................. 455/523
6,480,093 B1 * 11/2002 Chen .......................... 338/308

FOREIGN PATENT DOCUMENTS

JP 2002208803 A * 7/2002

* cited by examiner

*Primary Examiner*—Stephen E. Jones
(74) *Attorney, Agent, or Firm*—Morgan, Lewis & Bockius LLP

(57) ABSTRACT

An absorptive temperature-variable microwave attenuator is produced using at least two temperature-variable (or fixed) resistors in series with a transmission line. The temperature coefficients of the temperature-variable resistors are selected so that the attenuator changes at a controlled rate with changes in temperature while attenuator remains relatively matched to the transmission line. In one embodiment, the resistors are thick-film resistors and a variety of temperature coefficients can be created for each resistor by properly selecting and mixing different inks when forming the resistors. Furthermore, attenuators can be created having either a negative temperature coefficient of attenuation or a positive temperature coefficient of attenuation.

18 Claims, 2 Drawing Sheets

HIGH-FREQUENCY TEMPERATURE-VARIABLE ATTENUATOR

BACKGROUND OF THE INVENTION

1. Field of the Invention

The invention relates to temperature-variable microwave attenuators.

2. Description of the Related Art

Attenuators are used in applications that require signal level control. Level control can be accomplished by either reflecting a portion of the input signal back to its source or by absorbing some of the signal in the attenuator itself. The latter is often preferred because the mismatch which results from using a reflective attenuator can create problems for other devices in the system such as nonsymmetrical two-port amplifiers. It is for this reason that absorptive attenuators are more popular, particularly in microwave applications. The important parameters of an absorptive attenuator are: attenuation as a function of frequency; return loss; and stability over time and temperature.

It is known that variations in temperature can affect various component parts of a microwave system causing differences in signal strengths at different temperatures. In many cases, it is impossible or impractical to remove the temperature variations in some Radio Frequency (RF) components. For example, the gain of many RF amplifiers is temperature dependent. In order to build a system with constant gain, a temperature-dependent attenuator is placed in series with the amplifier. The attenuator is designed such that a temperature change that causes the gain of the amplifier to increase will simultaneously cause the attenuation of the attenuator to increase such that the overall gain of the amplifier-attenuator system remains relatively constant.

Prior art temperature-dependent attenuators employ connections between an unbalanced transmission line and ground or between two lines of a balanced line. Such constructions is not always optimal, especially at frequencies above 18 GHz. The reason for this is that parasitic capacitances and inductances can taint (or alter) the response of the device so that its attenuation over frequency and VSWR is no longer useful or desirable. It is typically desirable that the attenuation at any particular temperature is constant over the frequency of interest and the VSWR is as low as possible, usually less than 2.0 to 1. For frequencies exceeding 18 GHz, the prior art is unable to achieve this with any degree of accuracy. Therefore there is a real need for a temperature dependent attenuator that exhibits flat (or nearly flat) attenuation characteristics and low VSWR over selected portions of the frequency range of 18 GHz to 300 GHz.

The present invention solves these and other problems by providing a temperature-dependent attenuator that uses two or more temperature-dependent resistors in series with a transmission line. The attenuator can be used at radio frequencies, microwave frequencies, etc. In one embodiment, the temperature-dependent radio-frequency attenuator includes a plurality of temperature-dependent resistors electrically in series with a transmission line. The temperature-dependent resistors are in series with the transmission line approximately one-quarter wavelength apart at a desired frequency. The temperature coefficients of the resistors are configured such that the attenuator changes attenuation at a desired rate with changes in temperature.

In one embodiment, the resistors have different temperature coefficients. In one embodiment, the resistors have the same, or similar, temperature coefficients. In one embodiment, temperature coefficient of one or more of the resistors is a negative temperature coefficient of resistance. In one embodiment, temperature coefficient of one or more of the resistors is a positive temperature coefficient of resistance. In one embodiment, one or more of the resistors are film resistors. In one embodiment, one or more of the resistors are thick-film resistors. In one embodiment, one or more of the resistors are thin-film resistors. In one embodiment, one or more of the resistors are printed ink resistors.

In one embodiment, the attenuator has a negative temperature coefficient of attenuation. In one embodiment, the attenuator has a positive temperature coefficient of attenuation. In one embodiment, the transmission line includes a microstrip transmission line. In one embodiment, the transmission line includes a stripline transmission line.

In one embodiment, the attenuator has three resistors in series with the transmission line and approximately one-quarter wavelength apart. In one embodiment, the middle resistor in the series has a resistance that is approximately twice the resistance of the outer. In one embodiment, the two outer resistors have approximately the same resistance.

In one embodiment, an attenuator includes a series combination of temperature-dependent resistors separated by transmission line sections. In one embodiment, the transmission line sections have different lengths and/or characteristic impedances. In one embodiment, the lengths of the transmission line sections are symmetric about an electrical center of the attenuator.

In one embodiment, the attenuator uses a microstrip transmission line. In one embodiment, the attenuator uses a stripline transmission line. In one embodiment, the attenuator uses a co-planer waveguide transmission line. In one embodiment, the attenuator uses a grounded co-planar waveguide transmission line. In one embodiment, the attenuator uses a coaxial transmission line. In one embodiment, the VSWR of the attenuator remains below 3 to 1 over a desired operating band.

DETAILED DESCRIPTION

Figure 1:
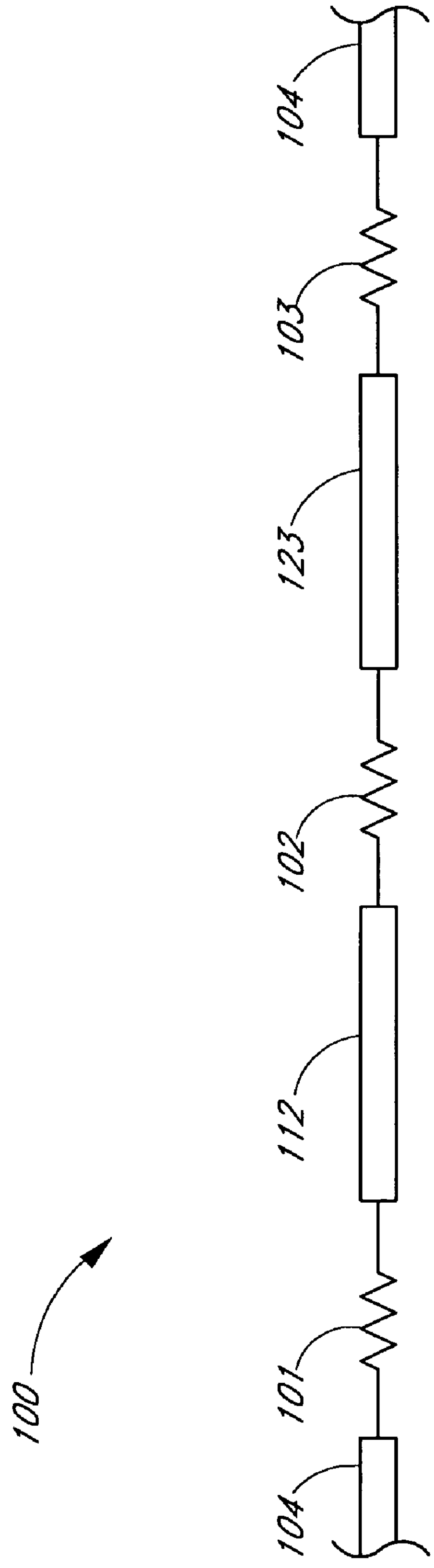
FIG. 1 is a schematic representation of a series attenuator with three resistors.

FIG. 1 is a schematic representation of a series absorptive attenuator 100 that includes three resistors 101–103 separated by transmission line sections 112 and 123. The resistor 101 is provided in series between a transmission line 104 and the transmission line section 112. The resistor 102 is provided in series between the transmission line section 112 and the transmission line section 123. The resistor 103 is provided in series between the transmission line section 123 and a transmission line 106. In one embodiment, the resistors 101–103 are thick-film resistors. The transmission line section 112 is one-quarter wavelength long at a first desired center frequency. The transmission line section 123 is one-quarter wavelength long at a second desired center frequency. In one embodiment, the first desired center frequency will be the same as the second desired center frequency. In one embodiment, the resistors 101–103 are temperature-dependent resistors (thermistors), where the resistance of each thermistor varies with temperature according to a temperature coefficient. In one embodiment, the resistors 101 and 103 have the same resistance and temperature coefficient. In one embodiment, the resistance of the resistor 102 is twice the resistance of the resistors 101 and 103. In one embodiment, the temperature coefficient of the resistor 102 is twice the temperature coefficient of the resistors 101 and 103. In one embodiment, the transmission lines 104, 112, 123, and 106 have the same characteristic impedance. FIG. 1 shows three resistors for purposes of illustration. One of ordinary skill in the art will recognize that two, three, four or more resistors separated by transmission line sections can be used.

The attenuator 100 behaves as a lossy transmission line, as the resistors 101–103 absorb a portion of the energy propagating between the transmission line 104 and the transmission line 106. If the resistance of the resistors 101–103 is different from the characteristic impedance of the transmission lines 104 and 106, then the resistors 101–103 will produce undesired reflections on the transmission lines 104 or 106.

By making the transmission line sections 112 and 123 one quarter wavelength long at a desired frequency, the reflections from the resistors will cancel at the desired frequency, and thus the reflections on the transmission lines 104 and 106 will be reduced or eliminated at the center frequency and in a band about the desired center frequency.

One of ordinary skill in the art will recognize that two, three, four or more resistors separated by transmission line sections can be used. The transmission line sections can be of different length and/or different characteristic impedance (e.g., different width). In one embodiment, standard microwave filter design techniques are used to design the attenuator by selecting the parameters that do not vary with frequency (e.g., the number of resistors, the lengths and impedances of the transmission lines, etc.), and then determining the resistor values at a number of temperatures to match the desired attenuation-temperature profile over the desired bandwidth. Once the resistances at a number of temperatures are known, the temperature coefficients of each resistor are selected to produce the desired temperature profile in each resistor.

In one embodiment, the resistors 101–103 are thick film resistors are produced by inks combining a metal powder, such as, for example, bismuth ruthenate, with glass frit and a solvent vehicle. This solution is deposited and then fired onto a ceramic substrate which is typically alumina but could also be beryllia ceramic, aluminum nitride, diamond, etc. When the resistor is fired, the glass frit melts and the metal particles in the powder adhere to the substrate, and to each other. This type of a resistor system can provide various ranges of material resistivities and temperature characteristics can be blended together to produce many different combinations.

The resistive characteristics of a thick film ink is specified in ohms-per-square (Ω/□). A particular resistor value can be achieved by either changing the geometry of the resistor or by blending inks with different resistivity. The resistance can be fine-tuned by varying the fired thickness of the resistor. This can be accomplished by changing the deposition thickness and/or the firing profile. Similar techniques can be used to change the temperature characteristics of the ink.

The temperature coefficient of a resistive ink defines how the resistive properties of the ink change with temperature. A convenient definition for the temperature coefficient of the resistive ink is the Temperature Coefficient of Resistance (TCR) often expressed in parts per million per degree Centigrade (PPM/C). The TCR can be used to calculate directly the amount of shift that can be expected from a resistor over a given temperature range. Once the desired TCR for a particular application is determined, it can be achieved by blending appropriate amounts of different inks. As with blending for sheet resistance, a TCR can be formed by blending two inks with TCR's above and below the desired TCR. One additional feature of TCR blending is that positive and negative TCR inks can be combined to produce large changes in the resulting material.

Some thermistors exhibit a resistance hysteresis as a function of temperature. If the temperature of the resistor is taken beyond the crossover point at either end of the hysteresis loop, the resistor will retain a memory of this condition. As the temperature is reversed, the resistance will not change in the same manner observed prior to reaching the crossover point. In one embodiment, to avoid this problem, the inks used in producing a temperature variable attenuator are selected with crossover points that are beyond the −55 deg. C. to 125 deg. C. operating range.

Figure 2:
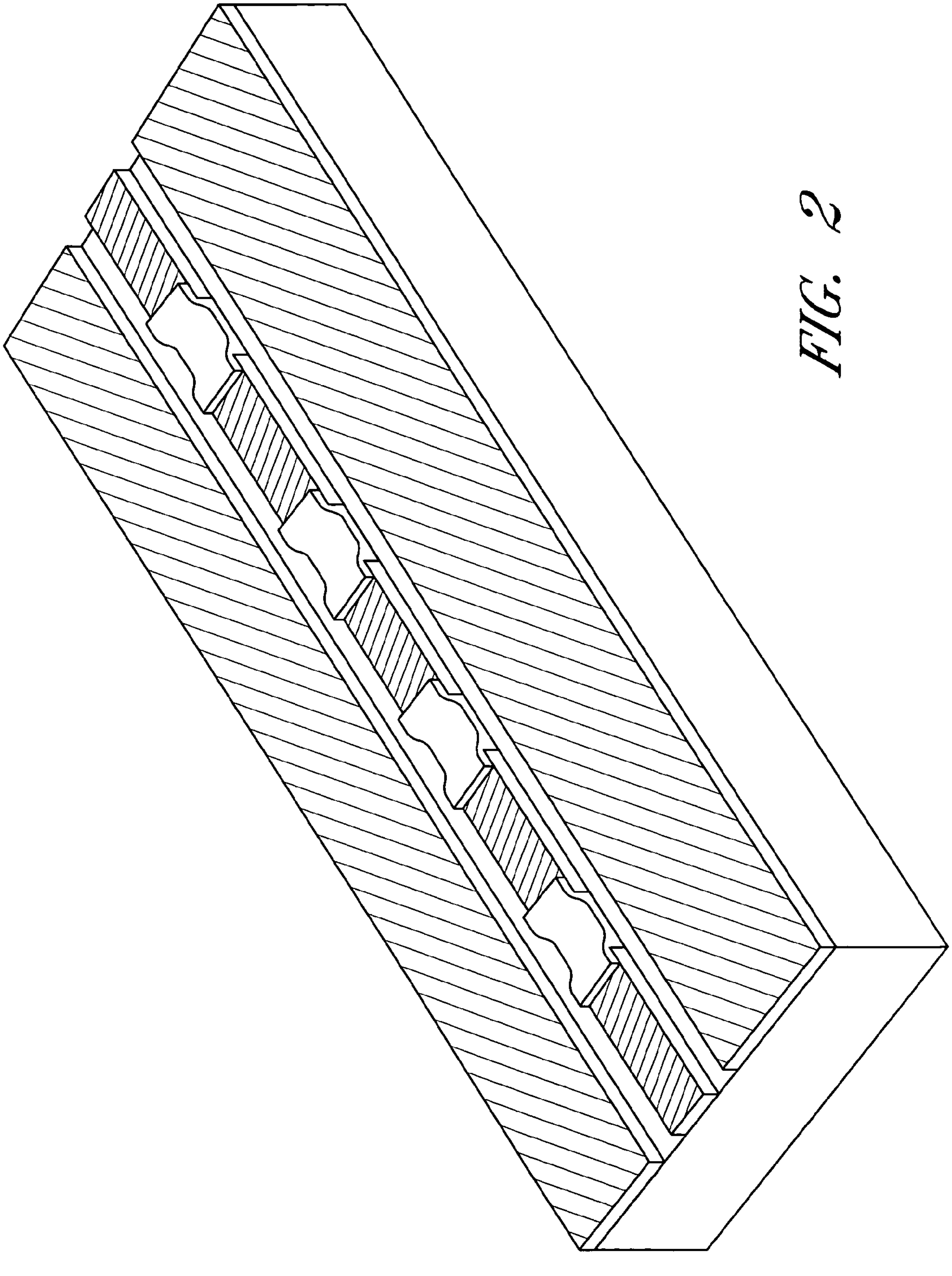
FIG. 2 is a perspective drawing of a series attenuator represented by the schematic of FIG. 1.

FIG. 2 shows one embodiment of attenuator construction wherein a substrate 214 is provided as a base. The substrate can be an insulating material such as, for example, aluminum oxide, Teflon, reinforced Teflon, fiberglass board, aluminum nitride, diamond, or beryllia ceramic, etc. The resistors 101–103 are provided as thick-film resistors 201–203. A transmission line section 212 is provided between the resistors 101 and 102. A transmission line section 223 is provided between the resistors 102 and 103. The transmission line sections are one quarter wavelength long at a desired center frequency.

The length of the resistors is determined by the sheet resistance of the thick-film material and the width of the resistors. In one embodiment, the width of the resistors is similar to the width of the transmission line sections to reduce inductive effects.

In one embodiment, the transmission line sections are made from thick film conductor which is deposited on the substrate 214. Thick film resistors 201–203 having the specifications described above and of the desired width and length are then formed. In one embodiment, the resistors 201–203 are then protected by a protective coating 222.

The present invention may be embodied in other specific forms without departing from the spirit or essential attributes thereof and accordingly reference should be made to the appended claims rather than to the foregoing specification as indicating the scope of the invention.

What is claimed is:

1. A temperature-dependent radio-frequency attenuator, comprising:

a first temperature-dependent resistor disposed in series with a transmission line, said first temperature-dependent resistor changing resistance with temperature according to a first temperature coefficient; and a second temperature-dependent resistor disposed in series with said transmission line approximately one-quarter wavelength from said first temperature-dependent resistor at a desired frequency, said second temperature-dependent resistor changing resistance with temperature according to a second temperature coefficient, said first and second temperature coefficients configured such that said attenuator changes attenuation at a desired rate with changes in temperature wherein said first temperature coefficient comprises a positive temperature coefficient of resistance and said second temperature coefficient comprises a negative temperature coefficient of resistance.

2. The temperature-dependent radio-frequency attenuator of claim 1, wherein said transmission line comprises a coaxial transmission line.

3. The temperature-dependent radio-frequency attenuator of claim 1, wherein a VSWR of said radio-frequency attenuator remains below 3 to 1 over a desired operating band.

4. The temperature-dependent radio-frequency attenuator of claim 1, wherein said first temperature coefficient is substantially similar to said second temperature coefficient.

5. The temperature-dependent radio-frequency attenuator of claim 1, wherein said first temperature-dependent resistor comprises a film resistor.

6. The temperature-dependent radio-frequency attenuator of claim 1, wherein said first temperature-dependent resistor comprises a thin film resistor.

7. The temperature-dependent radio-frequency attenuator of claim 1, wherein said first temperature-dependent resistor comprises a thick-film resistor.

8. The temperature-dependent radio-frequency attenuator of claim 1, wherein said first temperature-dependent resistor comprises a printed ink resistor.

9. The temperature-dependent radio-frequency attenuator of claim 1, wherein said attenuator has a negative temperature coefficient of attenuation.

10. The temperature-dependent radio-frequency attenuator of claim 1, wherein said attenuator has a positive temperature coefficient of attenuation.

11. The temperature-dependent radio-frequency attenuator of claim 1, wherein said transmission line comprises a microstrip transmission line.

12. The temperature-dependent radio-frequency attenuator of claim 1, wherein said transmission line comprises a stripline transmission line.

13. The temperature-dependent radio-frequency attenuator of claim 1, wherein said transmission line comprises a co-planer waveguide transmission line.

14. The temperature-dependent radio-frequency attenuator of claim 1, wherein said transmission line comprises a grounded co-planar waveguide transmission line.

15. The temperature-dependent radio-frequency attenuator of claim 1, further comprising a third temperature-dependent resistor disposed in series with said transmission line approximately one-quarter wavelength from said second temperature-dependent resistor such that said second temperature-dependent resistor lies electrically between said first temperature-dependent resistor and said third temperature-dependent resistor, said third temperature-dependent resistor changing resistance with temperature according to a third temperature coefficient.

16. The temperature-dependent radio-frequency attenuator of claim 15, wherein a resistance of said first temperature-dependent resistor is approximately equal to a resistance of said third temperature-dependent resistor.

17. A temperature-dependent radio-frequency attenuator, comprising:

a first temperature-dependent resistor disposed in series with a transmission line, said first temperature-dependent resistor changing resistance with temperature according to a first temperature coefficient;

a second temperature-dependent resistor disposed in series with said transmission line approximately one-quarter wavelength from said first temperature-dependent resistor at a desired frequency, said second temperature-dependent resistor changing resistance with temperature according to a second temperature coefficient, said first and second temperature coefficients configured such that said attenuator changes attenuation at a desired rate with changes in temperature; and a third temperature-dependent resistor disposed in series with said transmission line approximately one-quarter wavelength from said second temperature-dependent resistor such that said second temperature-dependent resistor lies electrically between said first temperature-dependent resistor and said third temperature-dependent resistor, said third temperature-dependent resistor changing resistance with temperature according to a third temperature coefficient, wherein a resistance of said first temperature-dependent resistor is approximately equal to a resistance of said third temperature-dependent resistor, and a resistance of said second temperature-dependent resistor is approximately equal to twice said resistance of said third temperature-dependent resistor.

18. A temperature-dependent radio-frequency attenuator, comprising:

a first temperature-dependent resistor disposed in series with a transmission line, said first temperature-dependent resistor changing resistance with temperature according to a first temperature coefficient;

a second temperature-dependent resistor disposed in series with said transmission line approximately one-quarter wavelength from said first temperature-dependent resistor at a desired frequency, said second temperature-dependent resistor changing resistance with temperature according to a second temperature coefficient, said first and second temperature coefficients configured such that said attenuator changes attenuation at a desired rate with changes in temperature; and a third temperature-dependent resistor disposed in series with said transmission line approximately one-quarter wavelength from said second temperature-dependent resistor such that said second temperature-dependent resistor lies electrically between said first temperature-dependent resistor and said third temperature-dependent resistor, said third temperature-dependent resistor changing resistance with temperature according to a third temperature coefficient, wherein a resistance of said second temperature-dependent resistor is approximately equal to twice a resistance of said first temperature-dependent resistor and said third temperature-dependent resistor.

* * * * *